US009825086B2

(12) United States Patent
Kawahara et al.

(10) Patent No.: US 9,825,086 B2
(45) Date of Patent: Nov. 21, 2017

(54) IMAGE PICKUP APPARATUS, IMAGE PICKUP SYSTEM, AND METHOD FOR MANUFACTURING IMAGE PICKUP APPARATUS

(71) Applicant: CANON KABUSHIKI KAISHA, Tokyo (JP)

(72) Inventors: Yuki Kawahara, Yokohama (JP); Hiroaki Kobayashi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 105 days.

(21) Appl. No.: 14/810,285

(22) Filed: Jul. 27, 2015

(65) Prior Publication Data
US 2016/0035768 A1 Feb. 4, 2016

(30) Foreign Application Priority Data
Jul. 31, 2014 (JP) ................................ 2014-156787

(51) Int. Cl.
*H01L 27/00* (2006.01)
*H01L 27/146* (2006.01)
*H01L 27/30* (2006.01)

(52) U.S. Cl.
CPC .... *H01L 27/14689* (2013.01); *H01L 27/1463* (2013.01); *H01L 27/14612* (2013.01); *H01L 27/14636* (2013.01); *H01L 27/14665* (2013.01); *H01L 27/14685* (2013.01); *H01L 27/14687* (2013.01); *H01L 27/14621* (2013.01); *H01L 27/14627* (2013.01); *H01L 27/307* (2013.01)

(58) Field of Classification Search
CPC ............................ H01L 51/441; H01L 27/307
See application file for complete search history.

(56) References Cited

U.S. PATENT DOCUMENTS

| | | | | |
|---|---|---|---|---|
| 2009/0218650 A1* | 9/2009 | Lee | ................... | H01L 27/14632 257/458 |
| 2010/0187501 A1* | 7/2010 | Toda | ...................... | B82Y 20/00 257/21 |
| 2012/0080675 A1* | 4/2012 | Nakatani | ............... | H01L 27/307 257/53 |

(Continued)

FOREIGN PATENT DOCUMENTS

JP S62-122268 A 6/1987

*Primary Examiner* — Thanh Luu
(74) *Attorney, Agent, or Firm* — Canon U.S.A., Inc. IP Division

(57) ABSTRACT

An image pickup apparatus includes a first pixel electrode connected to a pixel circuit, a second pixel electrode adjoining the first pixel electrode and connected to the pixel circuit, a photoelectric conversion film continuously covering the first and second pixel electrodes, and an opposite electrode facing the first and second pixel electrodes via the film. The film includes a recessed portion recessed toward a portion between the first and second pixel electrodes on a surface opposite to the first and second pixel electrodes. The depth of the recessed portion is greater than the first pixel electrode's thickness, and a distance from the first pixel electrode to the recessed portion is greater than a distance from the first pixel electrode to the second pixel electrode. The opposite electrode is provided continuously along the surface via the film, and the recessed portion surrounds a part of the opposite electrode.

11 Claims, 9 Drawing Sheets

(56) References Cited

U.S. PATENT DOCUMENTS

2014/0042416 A1\* 2/2014 Imai ................. H01L 27/307
  257/40
2015/0187843 A1\* 7/2015 Hatano ............. H01L 27/1464
  257/40

\* cited by examiner

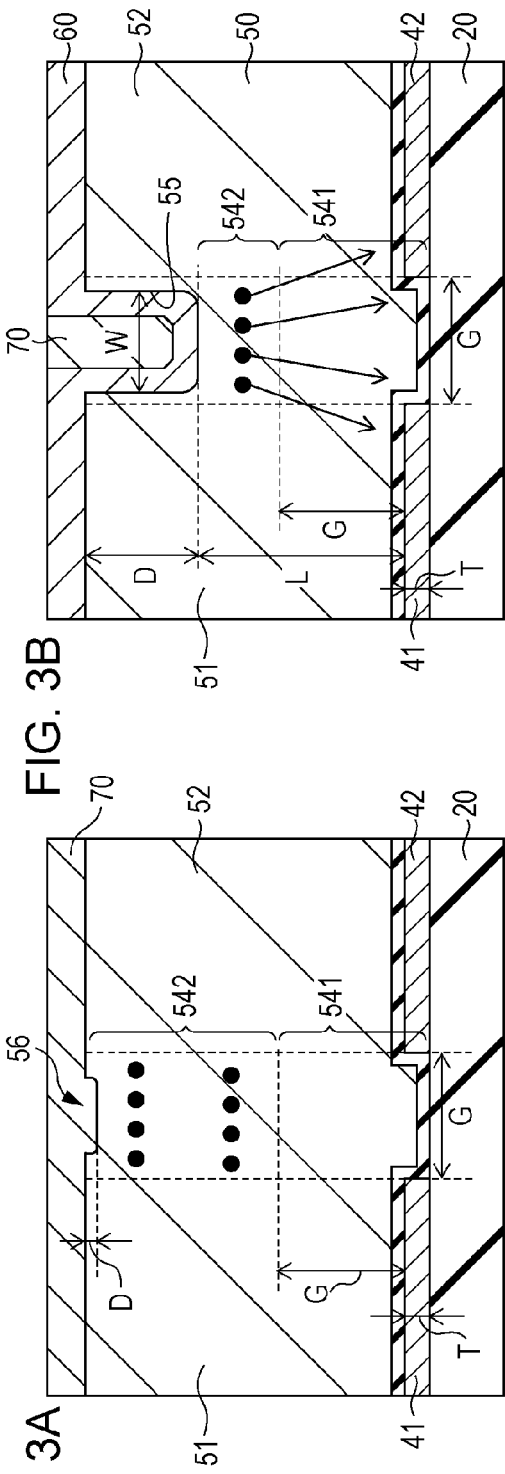
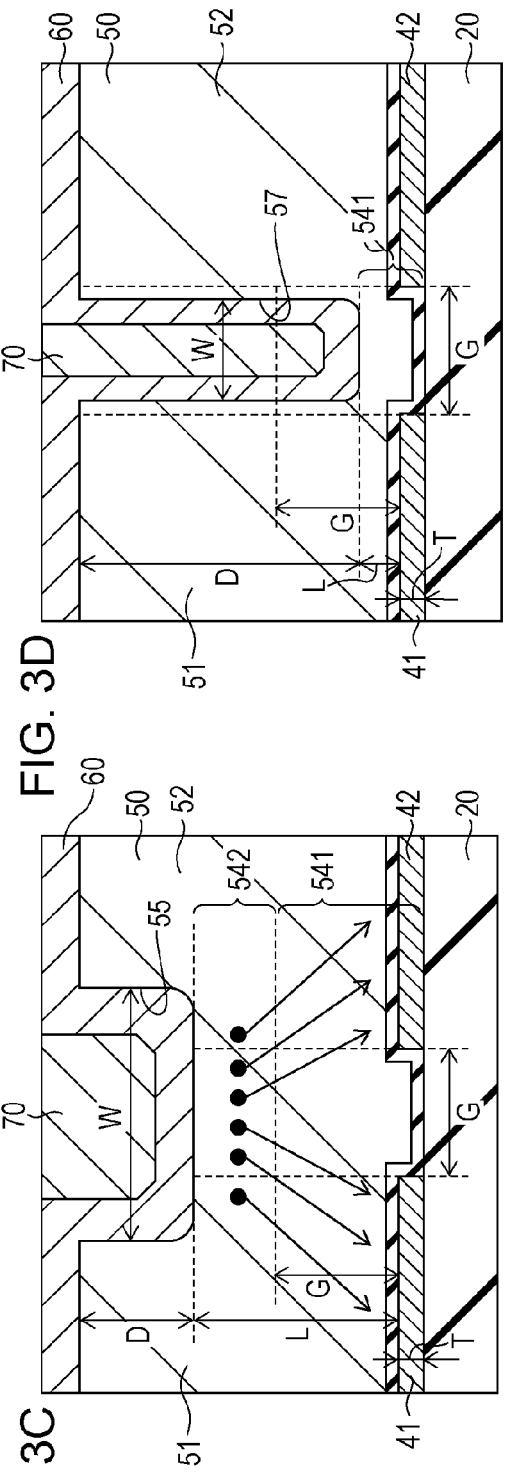

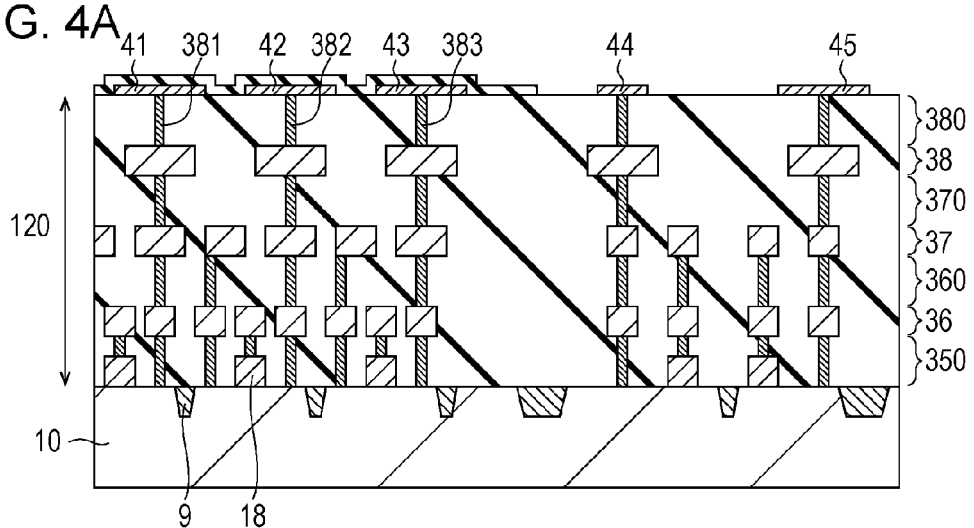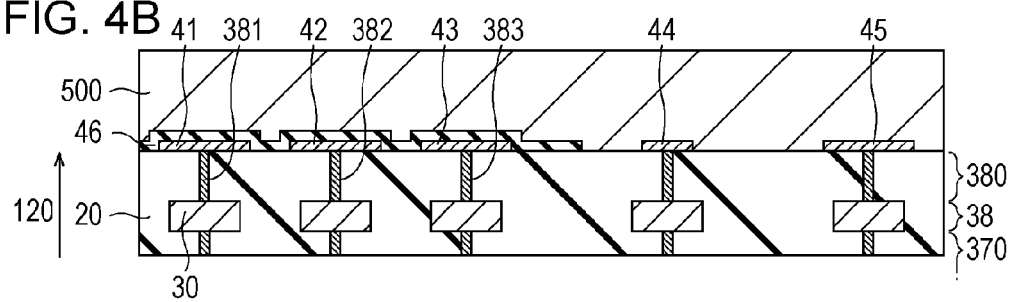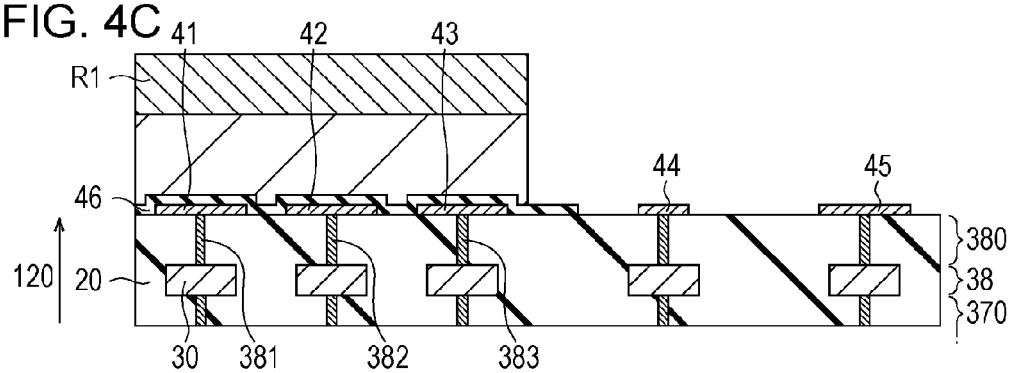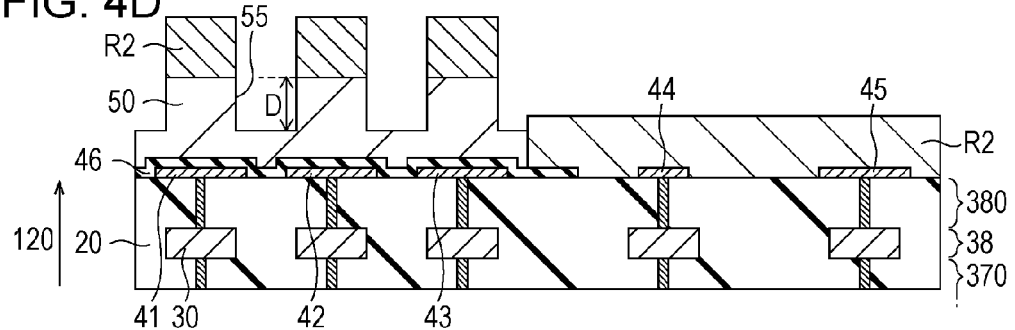

IMAGE PICKUP APPARATUS, IMAGE PICKUP SYSTEM, AND METHOD FOR MANUFACTURING IMAGE PICKUP APPARATUS

BACKGROUND OF THE INVENTION

Field of the Invention

The present technology relates to an image pickup apparatus provided with a photoelectric conversion film.

Description of the Related Art

An image pickup apparatus including, on a semiconductor substrate provided with a circuit, an electrode provided for each pixel (i.e., a pixel electrode), a photoelectric conversion film that covers the pixel electrode, and an upper electrode provided above the photoelectric conversion film has been proposed.

Japanese Patent Laid-Open No. 62-122268 discloses a solid-state image pickup element in which an impurity region for forming a potential barrier to a career is formed at a position to separate pixels. Forming a groove in a photoconductive layer is also disclosed.

Sensitivity can be improved by effectively using charge produced in pixel boundary portions. However, if charge produced in a pixel boundary portion is not guided to either of pixel electrodes and stays in the pixel boundary portion, it is possible that an image lag occurs in a picked up image.

Although Japanese Patent Laid-Open No. 62-122268 proposes a means for solving problems related to color mixture, study about improvement in sensitivity or reduction in image lag has not been sufficient.

The present technology provides an image pickup apparatus capable of improving sensitivity and reducing occurrence of an image lag.

SUMMARY OF THE INVENTION

The present technology is an image pickup apparatus, including a first pixel electrode, a second pixel electrode adjoining to the first pixel electrode, and a photoelectric conversion film configured to continuously cover the first pixel electrode and the second pixel electrode, and an opposite electrode facing the first pixel electrode and the second pixel electrode via the photoelectric conversion film. The photoelectric conversion film includes a recessed portion recessed toward a portion between the first pixel electrode and the second pixel electrode on a surface opposite to the first pixel electrode and the second pixel electrode. The depth of the recessed portion is greater than a thickness of the first pixel electrode, and the shortest distance from the first pixel electrode to the recessed portion is greater than the shortest distance from the first pixel electrode to the second pixel electrode. The opposite electrode is provided continuously along the surface via the photoelectric conversion film, and a part of the opposite electrode is surrounded by the recessed portion.

Further features of the present invention will become apparent from the following description of exemplary embodiments with reference to the attached drawings.

BRIEF DESCRIPTION OF THE DRAWINGS

FIGS. 3A to 3D are schematic plan views illustrating an exemplary image pickup apparatus.

FIGS. 4A to 4D are schematic sectional views illustrating an exemplary method for manufacturing an image pickup apparatus.

DESCRIPTION OF THE EMBODIMENTS

Figure 1A:
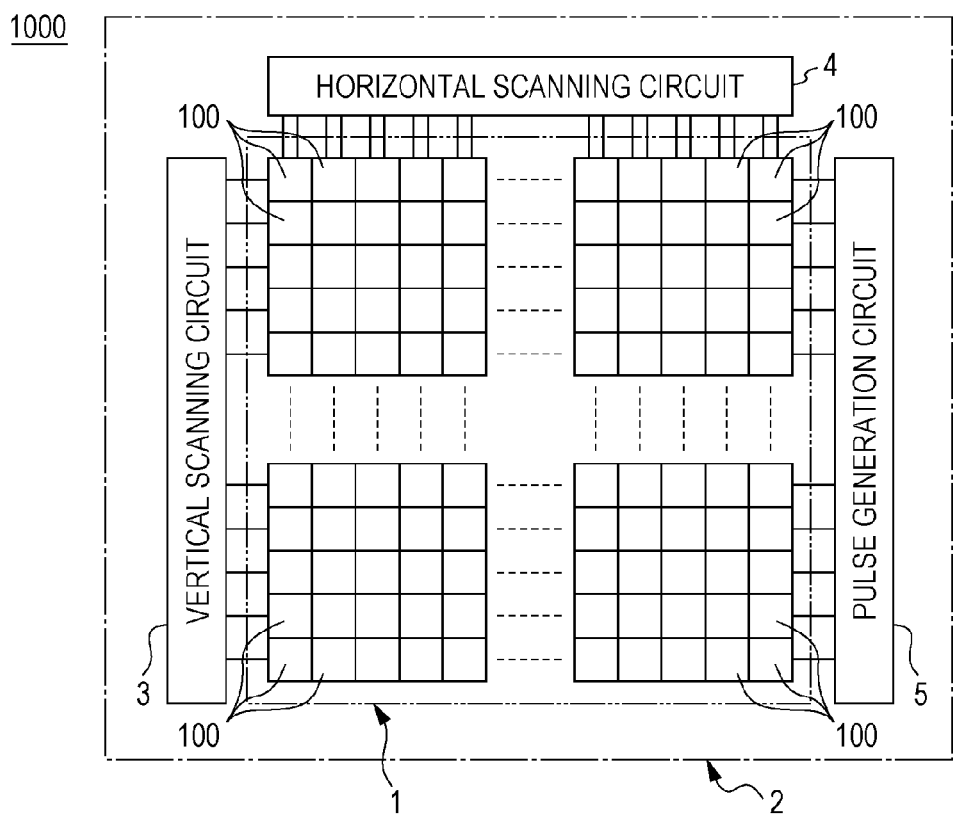
FIGS. 1A and 1B are schematic plan views illustrating an exemplary image pickup apparatus.

Hereinafter, an embodiment for implementing the present invention is described with reference to the drawings. In the following description and drawings, common configurations among a plurality of drawings are denoted by the same reference numerals. Common configurations among a plurality of drawings are mutually referred to one another, and description of the configurations denoted by the same reference numerals is omitted.

An entire configuration of an image pickup apparatus 1000 is described with reference to FIG. 1A. As illustrated in FIG. 1A, in the image pickup apparatus 1000, a plurality of pixels 100 are arranged two-dimensionally, e.g., in a matrix pattern (i.e., in a matrix) in a pixel region 1 surrounded by a two-dot chain line. In a peripheral region 2 located outside the pixel region 1 and is surrounded by a dashed line, peripheral circuits including, for example, a vertical scanning circuit 3, a horizontal scanning circuit 4, and a pulse generation circuit 5 are provided. The vertical scanning circuit 3 and the horizontal scanning circuit 4 are each formed by a shift register, and sequentially output, to each of the pixels 100, driving pulses in response to the application of a timing pulse from the pulse generation circuit 5.

Figure 1B:
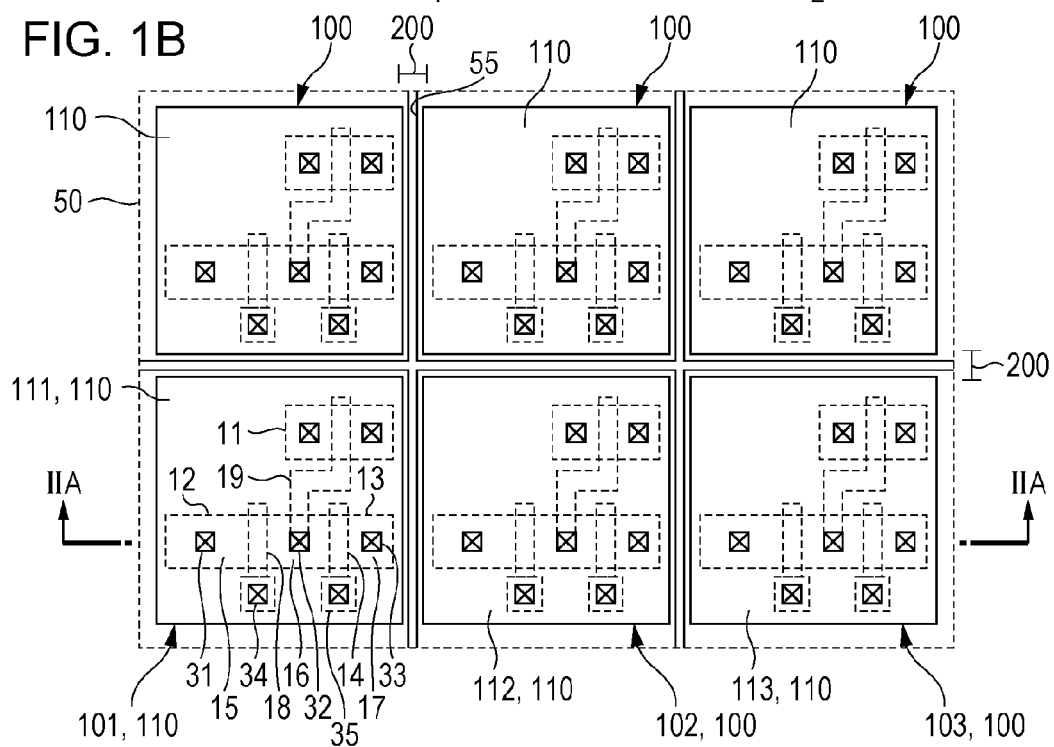

FIG. 1B is a plan view illustrating six pixels among pixels in the pixel region 1 of the image pickup apparatus 1000 illustrated in FIG. 1A. Adjoining pixels 100 may be separated by a pixel boundary portion 200. Each pixel 100 is provided with a photoelectric conversion portion, and a pixel circuit 110 that reads signal charge produced in the photoelectric conversion portion and generates a signal based on the signal charge. Although details are described later, the photoelectric conversion portion of each pixel corresponds to a part of a photoelectric conversion film 50 provided continuously over a plurality of pixels. The photoelectric conversion film 50 includes a recessed portion 55 in the pixel boundary portion 200.

In FIG. 1B, six pixels including a first pixel 101, a second pixel 102, and a third pixel 103 are illustrated as the pixels 100 provided in the image pickup apparatus 1000. The first pixel 101 is provided with a pixel circuit 111, the second pixel 102 is provided with a pixel circuit 112, and the third pixel 103 is provided with the pixel circuit 113.

The pixel circuit 110 is provided with a switching transistor 12 that has an n-type impurity region 15 as a source, an n-type impurity region 16 as a drain, and a gate 18. The pixel circuit 110 is provided also with a reset transistor 13 that has an n-type impurity region 16 as a source, an n-type impurity region 17 as a drain, and a gate 14. An amplifying transistor 11 having a gate 19 connected to the n-type impurity region 16 is provided. The amplifying transistor 11 constitutes, for example, a source follower circuit. Connecting portions 31 to 35 connected to wiring are provided in each of the impurity regions and the gate.

The image pickup apparatus 1000 may be provided with a package for containing a chip in addition to the chip containing the pixel region 1 described above. An image pickup system may be configured by using the image pickup apparatus 1000. The image pickup system is, for example, a camera or an information terminal having a photographing function. The image pickup system may be provided with a signal processing apparatus configured to process signals obtained from the image pickup apparatus, and/or a display apparatus configured to display images photographed by the image pickup apparatus.

First Embodiment

Figure 2A:
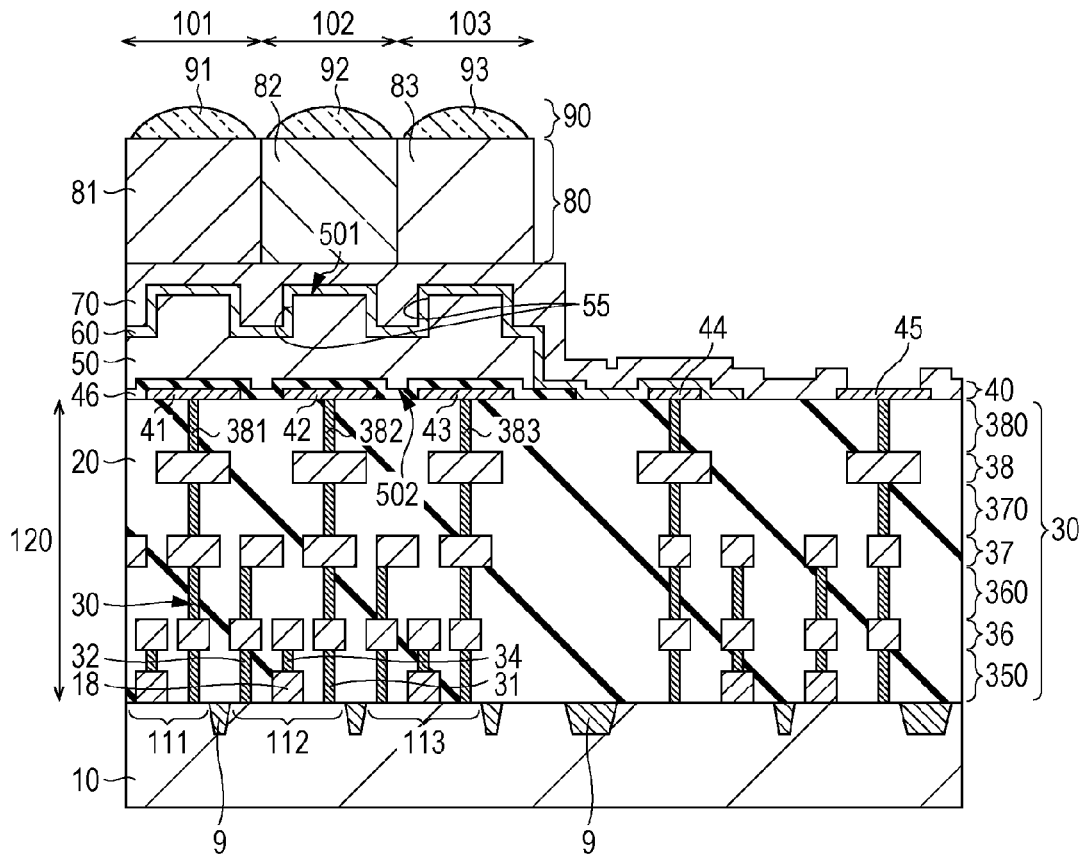
FIGS. 2A and 2B are schematic sectional views illustrating an exemplary image pickup apparatus.
Figure 2B:
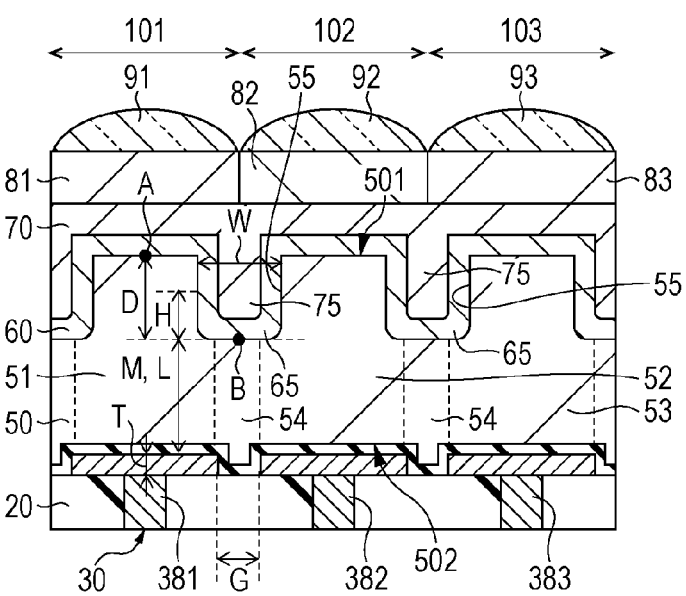

The image pickup apparatus 1000 according to a first embodiment is described with reference to FIGS. 2A and 2B. FIG. 2A illustrates a cross section of the pixel region 1 along line IIA-IIA of FIG. 1B, and a cross section of the peripheral region 2. FIG. 2B is an enlarged cross-sectional view of the neighborhood of the photoelectric conversion film 50. As illustrated in FIG. 2A, in the semiconductor substrate 10 in which a p-type well is formed, an element isolation region 9 configured by, for example, shallow trench isolation (STI) is formed. An impurity region (not illustrated) that functions, for example, as a source or a drain of each transistor of the pixel circuit 110 is provided in the semiconductor substrate 10. On the semiconductor substrate 10, a gate electrode layer that forms the gate 18 and other unillustrated gates 14 and 19 is provided via a gate insulating film (not illustrated). These configurations are common to the first pixel 101, the second pixel 102, and the third pixel 103.

On the semiconductor substrate 10, a contact plug 350 functioning as the connecting portions 31 to 35 is provided, and a first wiring layer 36 connected to the contact plug 350 is also provided. A second wiring layer 37 is provided on the first wiring layer 36 via a via plug 360, and a third wiring layer 38 is provided on the second wiring layer 37 via a via plug 370. A via plug 380 is provided on the wiring layer 38. Each of the wiring layers, the contact plugs, and the via plugs constitute a conductive member 30. The conductive member 30 is supported by a peripheral insulating member 20. In particular, the insulating member 20 is constituted by a plurality of insulating layers each of which are located between the wiring layers or located at the same height as that of each of the wiring layers. Thus, on the semiconductor substrate 10, a wiring structure 120 is formed by the conductive member 30 and the insulating member 20.

An electrode layer 40 is provided on the wiring structure 120. The electrode layer 40 includes a pixel electrode 41 provided in the first pixel 101, a pixel electrode 42 provided in the second pixel 102, and a pixel electrode 43 provided in the third pixel 103. The pixel electrode 42 adjoins to the pixel electrode 41 and to the pixel electrode 43. The electrode layer 40 may further include wiring 44 and a pad 45. The electrode layer 40 may have a conductive pattern not connected to the pixel circuit at a position between adjoining pixel electrodes and used for the wiring, light-shading, or shielding. The conductive member 30 is provided with a connecting portion 381 in contact with the pixel electrode 41, a connecting portion 382 in contact with the pixel electrode 42, and a connecting portion 383 in contact with the pixel electrode 43. The connecting portions 381, 382, and 383 are constituted by the via plug 380. The pixel electrode 41 is connected to the pixel circuit 111 of the first pixel 101 via the connecting portion 381 of the conductive member 30. The pixel electrode 42 is connected to the pixel circuit 112 of the second pixel 102 via the connecting portion 382 of the conductive member 30. The pixel electrode 43 is connected to the pixel circuit 113 of the third pixel 103 via the connecting portion 383 of the conductive member 30. A plurality of pixels may share a single pixel circuit.

As illustrated in FIG. 2B, a thickness of the pixel electrodes 41, 42, and 43 is denoted by T. The thickness T corresponds to a distance between an upper surface and a lower surface of the pixel electrode 41, 42, or 43. At least any of the pixel electrodes 41, 42, and 43 may have a distribution in thickness and, in that case, the thickness T may be an average value of the thickness of the pixel electrodes 41, 42, and 43. Although the pixel electrodes 41, 42, and 43 are equal in thickness in this example, the pixel electrodes 41, 42, and 43 may be different in thickness for each pixel.

The pixel electrodes 41, 42, and 43 are formed by at least any of metal, such as aluminum, copper, tungsten, titanium, and tantalum, and metallic compounds, such as titanium nitride, and tantalum nitride. For example, each of the pixel electrodes 41, 42, and 43 may be a multi-layer film including a conductive layer and a barrier metal layer. The conductive layer is constituted mainly by any metal, such as aluminum, copper, and tungsten. The barrier metal layer is constituted mainly by any of titanium, tantalum, titanium nitride, and tantalum nitride. Each of the pixel electrodes 41, 42, and 43 may be a single-layer film. The thickness T is, for example, equal to or greater than 0.01 μm and equal to or less than 1 μm. In a case where the pixel electrodes 41, 42, and 43 are constituted mainly by aluminum, the thickness T is, for example, equal to or greater than 0.1 μm and equal to or less than 1 μm. In a cases where the pixel electrodes 41, 42, and 43 are constituted mainly by tungsten, the thickness T is, for example, equal to or greater than 0.01 μm and equal to or less than 0.1 μm. Note that, in a case where the pixel electrodes 41, 42, and 43 are constituted mainly by aluminum, the thickness T may be less than 0.1 μm, or in a case where the pixel electrodes 41, 42, and 43 are constituted mainly by tungsten, the thickness T may be equal to or greater than 0.1 μm. The thickness T may be smaller than the thickness of each of the wiring layers 36, 37, and 38 constituting the conductive member 30.

A distance between adjoining pixel electrode 41 and pixel electrode 42 and a distance between adjoining pixel electrode 42 and pixel electrode 43 are denoted by G. The distance G is the shortest distance between adjoining pixel electrodes 41 and 42 and 43. For example, a distance between an end portion of the pixel electrode 41 on the side of the pixel electrode 42 and an end portion of the pixel electrode 42 on the side of the pixel electrode 41 is the distance G. A pitch P of adjoining pixel electrodes 41, 42, and 43 is a distance between centers of the pixel electrodes 41, 42, and 43, and differs from the distance G. Although the distance G between the pixel electrode 41 and the pixel electrode 42 is equal to the distance G between the pixel electrode 42 and the pixel electrode 43 in this example, the distance G between adjoining pixel electrodes may be varied for each pixel. The distance G is, for example, equal to or greater than 0.1 μm and equal to or less than 1 μm. If the thickness T is equal to or greater than 0.2 μm, the distance G is typically smaller than the thickness T (G<T). If the thickness T is less than 0.2 μm, the distance G is typically greater than the thickness T (T<G).

The photoelectric conversion film 50 is provided on the pixel electrode 41, the pixel electrode 42, and the pixel electrode 43. The photoelectric conversion film 50 continuously covers the pixel electrode 41, the pixel electrode 42, and the pixel electrode 43. In the photoelectric conversion film 50, a portion located above the pixel electrode 41 functions as the photoelectric conversion portion of the first pixel 101 (i.e., a photoelectric conversion portion 51). Similarly, a portion located above the pixel electrode 42 functions as the photoelectric conversion portion of the second pixel 102 (i.e., a photoelectric conversion portion 52), and a portion located above the pixel electrode 43 functions as the photoelectric conversion portion of the third pixel 103 (i.e., a photoelectric conversion portion 53). In the photoelectric conversion film 50, a portion not located above the pixel electrode, i.e., an intermediate portion 54 corresponding to a portion located between the pixel electrode 41 and the pixel electrode 42, is included in the pixel boundary portion 200 illustrated in FIG. 1B.

The photoelectric conversion film 50 may be a single-layer film or may be a multilayer film. The photoelectric conversion film 50 may be formed by an inorganic material or an organic material. The inorganic material may be, for example, a single crystal, amorphous or polycrystal semiconductor material. Specifically, an element semiconductor, such as Si and Ge, and a compound semiconductor, such as GaAs and ZnO, may be used. As other compound semiconductors, III-V compound semiconductors, such as BN, GaP, AlSb, and GaAlAsP, II-VI compound semiconductors, such as CdSe, ZnS, and HdTe, and IV-VI compound semiconductors, such as PbS, PbTe, and CuO may be used. As other inorganic materials, a compound of copper, indium and gallium, and selenium or sulfur (CIGS), and crystalline Se (selenium). The organic semiconductor material is, for example, fullerene, coumarin 6 (C6), Rhodamine 6G (R6G), zinc phthalocyanine (ZnPc), quinacridone, a phthalocyanine-based material, and a naphthalocyanine-based material. The photoelectric conversion film 50 as a multilayer film may, for example, have a pin structure consisting of a p-type semiconductor layer, an i-type semiconductor layer, and an n-type semiconductor layer. The photoelectric conversion film 50 may be formed by a composite material using both the inorganic material and the organic material. The photoelectric conversion film 50 may be a quantum dot film having a quantum dot structure in which semiconductor crystals, such as Si of which particle diameter is about 1 to 10 nm, are arranged. The thickness of the photoelectric conversion film 50 is set appropriately depending on light absorption characteristics of the material of the photoelectric conversion film 50. In a case where the photoelectric conversion film 50 formed by silicon is used, the thickness of the photoelectric conversion film 50 is, for example, equal to or greater than 1 μm and equal to or less than 5 μm. In a case where the photoelectric conversion film 50 having the quantum dot structure described above is used, the thickness of the photoelectric conversion film 50 is equal to or greater than 0.1 μm and equal to or less than 1 μm, and may be less than 0.5 μm. An amorphous silicon film, an organic semiconductor film, and a quantum dot film that are easily formed as a thin film of less than 1 μm are especially desirable. A quantum dot film with sufficiently compensated interface defects is still more desirable because the perfect depleting thereof is easy.

In the present embodiment, an insulating film 46 is provided between the pixel electrode 41, the pixel electrode 42 and the pixel electrode 43, and the photoelectric conversion film 50. An MIS structure in which the pixel electrodes 41, 42, and 43 are Metal, the insulating film 46 is Insulator, and the photoelectric conversion film 50 is Semiconductor is formed. Note that the pixel electrodes 41, 42, and 43 do not necessarily have to be metal and may be other materials behaving as metal. The photoelectric conversion film 50 does not necessarily have to be a semiconductor but may be other materials behaving as a semiconductor.

The thickness of the insulating film 46 may be smaller than the thickness T of the pixel electrodes 41, 42, and 43. The thickness of the insulating film 46 is, for example, equal to or greater than 1 nm and may be equal to or less than 100 nm. The insulating film 46 may be formed by a silicon compound, such as silicon oxide, silicon nitride, and silicon oxynitride, or a High-k material constituted by a metal oxide, such as hafnium oxide. Although the insulating film 46 continuously covers the pixel electrodes 41, 42, and 43 in this example, the insulating film 46 may be an isolated pattern separated for each of the pixel electrodes 41, 42, and 43.

The photoelectric conversion film 50 is provided with an upper surface 501 and a lower surface 502. The lower surface 502 is a surface on the side of the pixel electrodes 41, 42, and 43, and an inversion layer may be produced in the close vicinity of the lower surface 502 in the MIS structure described above. The upper surface 501 is the surface on the opposite side of the lower surface 502, and is a light incident surface in the photoelectric conversion film 50.

The photoelectric conversion film 50 is provided with a recessed portion 55 on the upper surface 501. The intermediate portion 54 is located below the recessed portion 55. The recessed portion 55 is recessed toward a portion between the pixel electrode 41 and the pixel electrode 42 at a boundary portion of the first pixel 101 and the second pixel 102. The recessed portion 55 is recessed toward a portion between the pixel electrode 42 and the pixel electrode 43 at a boundary portion of the second pixel 102 and the third pixel 103.

As illustrated in FIG. 2B, a depth of the recessed portion 55 is denoted by D and a width of the recessed portion 55 is denoted by W. The shape (i.e., the depth D and the width W) of the recessed portion 55 evaluates the shape of a portion located between a target pixel (i.e., a reference pixel) and a pixel adjoining to the target pixel. Hereinafter, description is given mainly with the target pixel as the first pixel 101 and a pixel adjoining to the target pixel as the second pixel 102, but the invention is not limited to the same: for example, the target pixel may be the third pixel 103 and the adjoining pixel may be the second pixel 102. The depth D of the recessed portion 55 can be measured in the following manner. First, a point A (i.e., a peak) furthest from the semiconductor substrate 10 in a region corresponding to the pixel electrode 41 (42, 43) of the upper surface 501 of the photoelectric conversion film 50 is defined. Next, a point B (i.e., a bottom of the recessed portion 55) nearest to the semiconductor substrate 10 in a region not corresponding to the pixel electrode 41 (42, 43) of the upper surfaces 501 of the photoelectric conversion film 50 is defined. The depth D of the recessed portion 55 corresponds to the distance between the point A and the point B in a direction vertical to a principal surface of the semiconductor substrate 10. The depth D is equal to or greater than 0.1 μm and equal to or less than 1 μm, and may be less than 0.5 μm. The width W of the recessed portion 55 corresponds to a gap of the photoelectric conversion film 50 in a direction parallel to the principal surface of the semiconductor substrate 10 at the position of the height H (H=D/2) from the bottom of the recessed portion 55, and corresponds to the full width at half maximum in the height distribution of the upper surface 501 of the photoelectric conversion film 50. The width W is equal to or greater than 0.1 μm and equal to or less than 1 μm, and may be less than 0.5 μm.

The distance from the pixel electrodes 41, 42, and 43 to the recessed portion 55 is denoted by L. The distance L is the shortest distance between the pixel electrode 41 and the recessed portion 55, the shortest distance between the pixel electrode 42 and the recessed portion 55, and the shortest distance between the pixel electrode 43 and the recessed portion 55. For example, the distance between the recessed portion 55 located between the first pixel 101 and the second pixel 102 and an end portion of the pixel electrode 41 on the side of the recessed portion 55 is the distance L. Although the distance L from the pixel electrode 41 to the recessed portion 55, the distance L from the pixel electrode 42 to the recessed portion 55, and the distance L from the pixel electrode 43 to the recessed portion 55 are the same in this example, the distance from the pixel electrode to the recessed portion may be varied for each pixel. The distance L is equal to or greater than 0.1 μm and equal to or less than 1 μm, and may be less than 0.5 μm.

In a case where the distance L, the width W, the depth D, the thickness T, the distance G, and the like are varied depending on the pixels, one of pixels of a pair of adjoining specific pixels is defined as a target pixel, and then a relationship between the target pixel and another, adjoining pixel is defined.

In the present embodiment, the depth D of the recessed portion 55 is greater than the thickness T of the pixel electrodes 41, 42, and 43 (T<D). This means that the recessed portion 55 having the depth D greater than a step formed by the pixel electrodes 41, 42, and 43 and the underlying insulating member 20 and having a height equivalent to the thickness T is provided in the photoelectric conversion film 50. That is, since the photoelectric conversion film 50 is formed conformal to the step having the height equivalent to the thickness T, unevenness with a difference in height greater than unevenness that may be produced naturally on the upper surface 501 is provided on the upper surface 501 of the photoelectric conversion film 50.

The distance L from the pixel electrodes 41, 42, and 43 to the recessed portion 55 is greater than the distance G (L>G). This means that the recessed portion 55 is not provided in a gap corresponding to the thickness T located between the pixel electrode 41 and the pixel electrode 42, but is located at a position sufficiently distant toward the upper surface 501 from the gap corresponding to the thickness T located between the pixel electrode 41 and the pixel electrode 42. A distance M from the pixel electrodes 41, 42, and 43 to an opposite electrode 60 is desirably greater than the distance G (M>G). The width W of the recessed portion 55 is desirably greater than the distance G (W>G). Thus, by employing a configuration satisfying T<D and L>G, an image pickup apparatus capable of improving sensitivity and reducing occurrence of an image lag can be provided. Note that there is a possibility that a certain pixel pair satisfies a later-described positional relationship of the recessed portion 55 and the pixel electrode and another pixel pair does not satisfy a later-described positional relationship of the recessed portion 55 and the pixel electrode. That is, if at least one pixel pair satisfies L>G and T<D described above in the pixel region 1, it is possible to improve sensitivity of that pixel pair and, at the same time, reduce an image lag caused by charge existing in the pixel boundary portion 200 between that pixel pair.

The opposite electrode 60 is provided above the photoelectric conversion film 50. The opposite electrode 60 is a conductor film facing the pixel electrode 41, the pixel electrode 42, and the pixel electrode 43 via the photoelectric conversion film 50. In the present embodiment, the opposite electrode 60 and the photoelectric conversion film 50 are in contact with each other. The opposite electrode 60 is provided continuously along the upper surface 501. Since the conducting film used as the opposite electrode 60 is provided common to each pixel, the opposite electrode 60 may be referred to as a common electrode. The opposite electrode 60 is light transmissive in a wavelength region of light that is photoelectrically converted by the photoelectric conversion film 50, e.g., in a visible light region. The opposite electrode 60 may be desirably formed by ITO and ZnO.

The opposite electrode 60 is provided with a projecting portion 65 projecting toward the recessed portion 55 and surrounded by the recessed portion 55. In the present embodiment, no insulating material exists between at least a part of the recessed portion 55 and the opposite electrode 60, and the projecting portion 65 is in contact with the recessed portion 55. A distance from the pixel electrodes 41, 42, and 43 to the opposite electrode 60 is denoted by M. The distance M is the shortest distance between the pixel electrode 41 and the opposite electrode 60, the shortest distance between the pixel electrode 42 and the opposite electrode 60, and the shortest distance between the pixel electrode 43 and the opposite electrode 60. In the present embodiment, the opposite electrode 60 is in contact with the recessed portion 55 at the portion especially closest to the pixel electrodes 41, 42, and 43. Therefore, the distance M is equal to the distance L (L=M). The opposite electrode 60 in this example is in contact with the bottom (i.e., the point B) of the recessed portion 55. The distance M is equal to or greater than 0.1 μm and equal to or less than 1 μm, and may be less than 0.5 μm.

A refractive index of the opposite electrode 60 is desirably lower than a refractive index of the photoelectric conversion film 50. With this relationship of the refractive index, a light guide structure in which the projecting portion 65 of the opposite electrode 60 surrounded by the recessed portion 55 functions as a clad and the photoelectric conversion film 50 sandwiched between the projecting portions 65 functions as a core can be formed. Then, compared with a case where the refractive index of the opposite electrode 60 is equal to the refractive index of the photoelectric conversion film 50, reflected light on a side wall of the recessed portion 55 increases, and therefore sensitivity can be increased and color mixture can be reduced. The opposite electrode 60 may be formed by, for example, a transparent conductive material having the refractive index of 1.9 to 2.2, such as ITO. The photoelectric conversion film 50 may be formed by a composite material, such as silicon having a refractive index of about 3 to 4, and a quantum dot film having a refractive index of 1.5 to 2.5. For example, by using a composite material in which particles having a refractive index of equal to or greater than 2.5 are dispersed in resin having a refractive index of less than 2.0, an effective refractive index can be increased greater than 2.2. By adjusting concentration of particles to be dispersed in the resin, the effective refractive index can be controlled, and the light guide structure can be formed together with the opposite electrode 60 having the refractive index of 1.9 to 2.2.

A dielectric film 70 is provided on the opposite electrode 60. The dielectric film 70 is provided continuously along the upper surface 501 of the photoelectric conversion film 50 to cover the opposite electrode 60. The dielectric film 70, which covers the wiring 44, has an opening above the pad 45 to expose the pad 45. The dielectric film 70 may function as at least any of an antireflection film, a passivation film, and a planarizing film. The dielectric film 70 does not necessarily have to cover the opposite electrode 60 and/or the wiring 44.

The dielectric film 70 is provided with a projecting portion 75 projecting toward the recessed portion 55 and surrounded by the recessed portion 55. In the present embodiment, the projecting portion 75 is in contact with the projecting portion 65 of the opposite electrode 60.

The refractive index of the dielectric film 70 is desirably lower than the refractive index of the photoelectric conversion film 50 and/or the refractive index of the opposite electrode 60. With this relationship of the refractive index, a light guide structure in which the projecting portion 75 of the dielectric film 70 surrounded by the recessed portion 55 functions as a clad and the photoelectric conversion film 50 sandwiched between the projecting portions 75 and/or the opposite electrode 60 functions as a core can be formed. Thus, an amount of the reflected light on the side wall of the recessed portion 55 is increased and, therefore, sensitivity can be improved and color mixture can be reduced.

The dielectric film 70 may be formed by, for example, silicon oxide having a refractive index of 1.4 to 1.6, silicon oxynitride having a refractive index of 1.6 to 1.8, or silicon nitride having a refractive index of 1.8 to 2.3. The dielectric film 70 may be a multi-layer film configured by laminating a plurality of dielectric layers formed by these materials. It is only necessary to select the materials of the dielectric film 70, the opposite electrode 60, and the photoelectric conversion film 50 to satisfy the relationship of the refractive index described above.

It is also desirable that the opposite electrode 60 has a refractive index between the refractive index of the dielectric film 70 and the refractive index of the photoelectric conversion film 50. This is because, with this configuration, the opposite electrode 60 can form an antireflection structure that functions as the antireflection film between the dielectric film 70 and the photoelectric conversion film 50 in a region outside the recessed portion 55. By setting the relationship of the refractive index film to be dielectric film 70<opposite electrode 60<photoelectric conversion film 50, a structure having both the light guide structure and the antireflection structure can be implemented.

A color filter array 80 is provided on dielectric film 70, and a lens array 90 is provided on the color filter array 80. The color filter array 80 is constituted by a color filter 81, a color filter 82, and a color filter 83. The color filter 81 superimposed on the pixel electrode 41 is included in the first pixel 101. Similarly, the color filter 82 superimposed on the pixel electrode 42 is included in the second pixel 102, and the color filter 83 superimposed on the pixel electrode 43 is included in the third pixel 103. The lens array 90 is constituted by microlenses 91, 92, and 93. The microlens 91 superimposed on the pixel electrode 41 is included in the first pixel 101. Similarly, the microlens 92 superimposed on the pixel electrode 42 is included in the second pixel 102, and the microlens 93 superimposed on the pixel electrode 43 is included in the third pixel 103.

When light enters the photoelectric conversion film 50 via the lens array 90, the color filter array 80, the dielectric film 70, and the opposite electrode 60, the light is photoelectrically converted and signal charge is generated. The signal charge may be a positive hole or an electron. A polarity of the signal charge is determined depending on potentials of the pixel electrodes 41, 42, and 43 and a potential of the opposite electrode 60. A potential in accordance with the amount of the signal charge and the capacitance of the MIS structure appears in each of the pixel electrodes 41, 42, and 43, and a potential of the impurity region 15 is changed via the conductive member 30. When the switching transistor 12 is turned ON, a potential of the impurity region 16 is changed depending on the potential of the impurity region 15. The amplifying transistor 11 provided with the gate 19 connected to the impurity region 16 can output signals in accordance with the potential of the impurity region 16, i.e., signals in accordance with the charge of the photoelectric conversion portions 51, 52, and 53. When the switching transistor 12 is turned OFF and the reset transistor 13 is turned ON, the potential of the impurity region 16 can be reset. Refreshing of the photoelectric conversion film 50, i.e., discharging the signal charge, can be performed via the opposite electrode 60 by setting the potential of the opposite electrode 60 to a refreshment potential. In the present embodiment, the depth D of the recessed portion 55 is greater than the thickness T of the pixel electrodes 41, 42, and 43 (T<D). This means that the recessed portion 55 having the depth D greater than a step formed by the pixel electrodes 41, 42, and 43 and the underlying insulating member 20 and having a height equivalent to the thickness T is provided in the photoelectric conversion film 50. That is, since the photoelectric conversion film 50 is formed conformal to the step having the height equivalent to the thickness T, unevenness with a difference in height greater than unevenness that may be produced naturally on the upper surface 501 is provided on the upper surface 501 of the photoelectric conversion film 50.

The distance L from the pixel electrodes 41, 42, and 43 to the recessed portion 55 is greater than the distance G (L>G). This means that the recessed portion 55 is not provided in a gap corresponding to the thickness T located between the pixel electrode 41 and the pixel electrode 42, but is located at a position sufficiently distant toward the upper surface 501 from the gap corresponding to the thickness T located between the pixel electrode 41 and the pixel electrode 42. A distance M from the pixel electrodes 41, 42, and 43 to an opposite electrode 60 is desirably greater than the distance G (M>G). The width W of the recessed portion 55 is desirably greater than the distance G (W>G).

Differences caused by the position and the shape of the recessed portion 55 are described with reference to FIGS. 3A to 3D. FIGS. 3A to 3D are enlarged sectional views in the vicinity of the pixel boundary portion 200. An intermediate portion 54 not corresponding to (i.e., superimposed on) the pixel electrode 41 nor the pixel electrode 42 can be divided into a plurality of portions. A plurality of portions include a first portion 541 of which distance from the pixel electrodes 41 and 42 is shorter than the distance G, and a second portion 542 of which distance from the pixel electrodes 41 and 42 is longer than the distance G. A part of the first portion 541 is located between the pixel electrode 41 and the pixel electrode 42. Since charge existing in the first portion 541 is located at a position close to both the pixel electrode 41 and the pixel electrode 42 in the intermediate portion 54, it is difficult to control this charge. However, if the charge existing in the second portion 542 can be guided to an appropriate pixel electrode, sensitivity can be improved. In FIGS. 3A to 3C, black dots represent charge produced as a result of photoelectric conversion in the second portion 542.

FIG. 3A illustrates a case where only a recessed portion 56 that does not satisfy T<D exists in the photoelectric conversion film 50. In the case illustrated in FIG. 3A, the charge located in the second portion 542 distant from the pixel electrodes 41 and 42 is not guided to the pixel electrodes 41 and 42 and remains. The remained charge is a cause of the image lag. Such an image lag may be notably caused in a case where T<G.

FIG. 3B illustrates a case where the recessed portion 55 is provided so that L>G is satisfied. The recessed portion 55 satisfies W<G. By providing the recessed portion 55 on the upper surface 501, the volume of the second portion 542 in which the image lag often occurs can be reduced and, therefore, generation of charge that causes the image lag at positions distant from the pixel electrodes 41 and 42 can be reduced. By an electric field formed by the pixel electrodes 41 and 42 and the opposite electrode 60 between the upper surface 501 and the lower surface 502 of the photoelectric conversion film 50, the charge produced in the second portion 542 can be guided efficiently to the desired pixel electrodes 41 and 42. Especially if the opposite electrode 60 is surrounded by the recessed portion 55, the electric field produced between the pixel electrodes 41, 42 and the opposite electrode 60 by the projecting portion 65 of the opposite electrode 60 surrounded by the recessed portion 55 becomes strong in the intermediate portion 54 and, therefore, such a configuration is advantageous for the elimination of the image lag.

Substantially the same potential is supplied to the adjoining pixel electrode 41 and pixel electrode 42 during the photoelectric conversion (i.e., during one vertical scanning period and/or one horizontal scanning period). Thus, a potential difference between the pixel electrode 41 and the pixel electrode 42 is smaller than a potential difference between the pixel electrodes 41, 42 and the opposite electrode 60. Therefore, most electric field produced between the pixel electrode 41 and the pixel electrode 42 can be ignored.

FIG. 3C also illustrates a case where the recessed portion 55 is provided to satisfy L>G. The recessed portion 55 satisfies W>G. In this example, since the recessed portion 55 is disposed to overlap the pixel electrodes 41 and 42, crosstalk (i.e., color mixture) can be further reduced compared with the case where W<G is satisfied.

FIG. 3D illustrates a case where a recessed portion 57 is provided so as not to satisfy L>G. In this case, because the amount of charge produced in the intermediate portion 54 is small, color mixture is reducible, whereas high sensitivity is not obtainable. Since the distance between the opposite electrode 60 and the pixel electrodes 41, 42 becomes very short, there is a possibility that the opposite electrode 60 and the pixel electrodes 41, 42 are short-circuited. To reduce short-circuiting, it is necessary to improve breakdown voltage by elongating the distance G greater than that illustrated in FIG. 3D to increase the distance between the opposite electrode 60 and the pixel electrodes 41, 42 in a horizontal direction (i.e., a direction in which the pixel electrodes 41 and 42 are arranged). However, such a measure brings about disadvantageous effects of lowered sensitivity due to a decrease in size of the pixel electrodes 41 and 42, and decreased resolution due to enlarged pixel boundary portion 200.

A method for manufacturing the image pickup apparatus 1000 illustrated in FIG. 2A is described with reference to FIGS. 4A to 4D. As illustrated in FIG. 4A, the semiconductor substrate 10 provided with various transistors of the pixel circuit 110 and various transistors of peripheral circuits is formed using a suitable CMOS process. The wiring structure 120 provided with the conductive member 30 and the insulating member 20 is formed on the semiconductor substrate 10 using a suitable multi-layer wiring process. The conducting film having the thickness T is formed on the wiring structure 120 and the conducting film is patterned, whereby the pixel electrodes 41, 42, and 43 of the electrode layer 40, the wiring 44, and the pad 45 are formed. The insulating film formed to cover the pixel electrodes 41, 42, and 43, the wiring 44, and the pad 45 is patterned to expose the wiring 44 and the pad 45, whereby the insulating film 46 is formed.

Next, as illustrated in FIG. 4B, the photoelectric conversion film 500 is formed to cover the pixel electrodes 41, 42, and 43 via the insulating film 46. The photoelectric conversion film 500 is formed of an organic or an inorganic semiconductor material by any of the methods of vapor phase film deposition, liquid phase film deposition, and solid phase film deposition. The vapor phase film deposition includes PVD methods, such as epitaxial growth, vapor deposition and sputtering, and various CVD methods. The liquid phase film deposition includes coating methods, such as spin coating, spraying and dipping, and plating. The solid phase film deposition includes sticking a solid photoelectric conversion film 500 previously formed in a film shape to the pixel electrodes 41, 42, and 43.

Then, as illustrated in FIG. 4C, a mask R1 is formed at a portion of the photoelectric conversion film 500 corresponding to the pixel region 1. The mask R1 has openings corresponding to the wiring 44 and the pad 45. The photoelectric conversion film 500 is etched using the mask R1 to remove unnecessary portions of the photoelectric conversion film 500.

As illustrated in FIG. 4D, a mask R2 is formed at portions of the photoelectric conversion film 500 corresponding to the pixel electrodes 41, 42, and 43. The mask R2 has openings corresponding to the portions located between the pixel electrodes 41, 42, and 43. The photoelectric conversion film 500 is etched using the mask R2 to form the photoelectric conversion film 50 in which the recessed portion 55 having the depth D (D>T) is provided.

The mask R2 is then removed and the opposite electrode 60 is formed on the photoelectric conversion film 50. The opposite electrode 60 is formed along the recessed portion 55 by, for example, sputtering, CVD, and spin coating the transparent conductive material, such as ITO and ZnO. The dielectric film 70 is formed on the opposite electrode 60. The dielectric film 70 may be a single-layer film or a multilayer film including at least one of an inorganic material layer, such as silicon oxide and silicon nitride, provided for the purpose of passivation, and an organic material layer (i.e., a resin layer) provided for the purpose of planarization. The color filter array 80 and the lens array 90 are formed on the dielectric film 70, whereby the image pickup apparatus 1000 illustrated in FIG. 1 can be obtained.

Second Embodiment

Figure 5A:
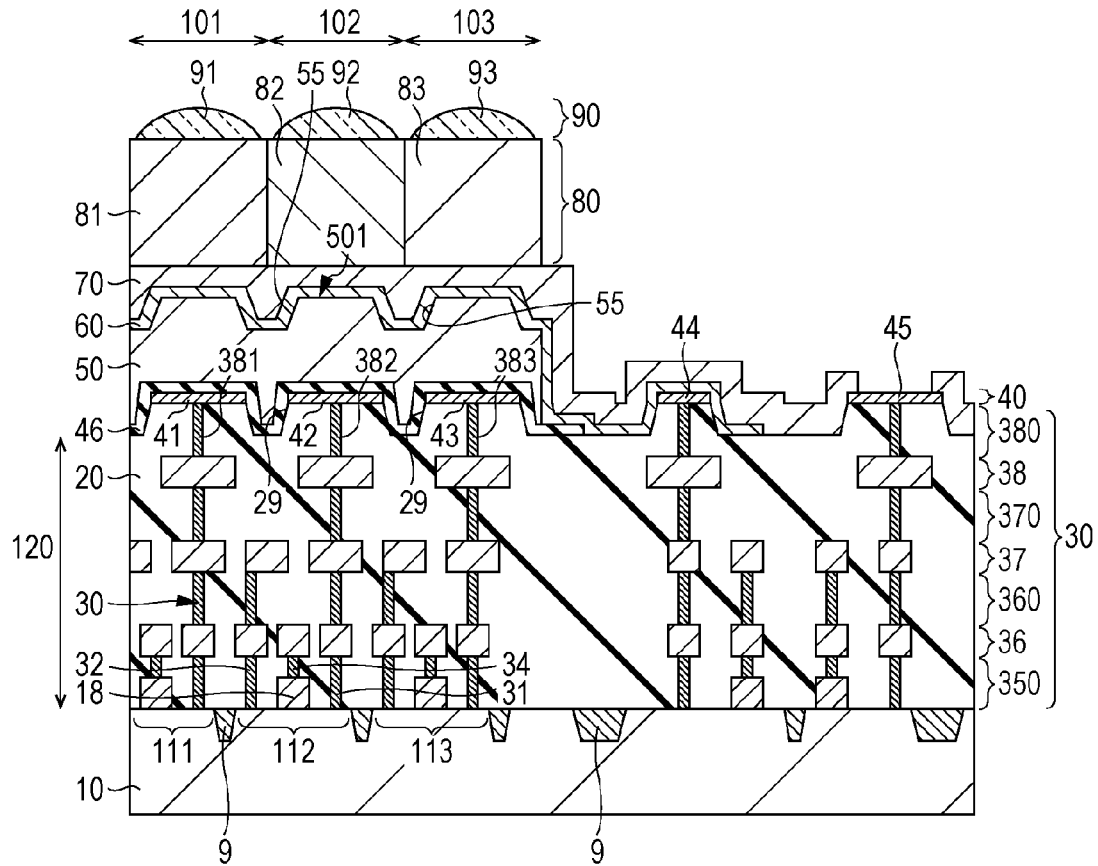
FIGS. 5A and 5B are schematic sectional views illustrating an exemplary image pickup apparatus.
Figure 5B:
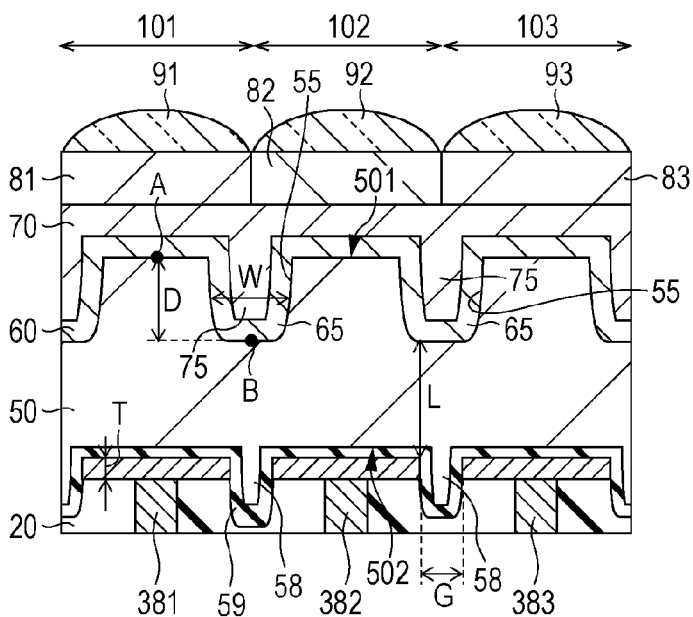

The image pickup apparatus 1000 according to a second embodiment is described with reference to FIGS. 5A and 5B. FIG. 5A illustrates a cross section of the pixel region 1 along line IIA-IIA of FIG. 1B, and a cross section of the peripheral region 2. FIG. 5B is an enlarged cross-sectional view of the neighborhood of the photoelectric conversion film 50. The second embodiment differs from the first embodiment in the shape of the upper surface of the insulating member 20 and the shapes of the upper surface 501 and the lower surface 502 of the photoelectric conversion film 50. Other configurations are the same as those of the first embodiment, and detailed description thereof is omitted.

A groove 29 is provided on an upper surface of the insulating member 20. The groove 29 is provided between the connecting portion 381 to which the pixel electrode 41 is connected and the connecting portion 382 to which the pixel electrode 42 is connected. The groove 29 is located below a portion between the pixel electrode 41 and the pixel electrode 42. The groove 29 is also provided between the connecting portion 382 to which pixel electrode 42 is connected and the connecting portion 383 to which the pixel electrode 43 is connected. The groove 29 is located below a portion between the pixel electrode 42 and the pixel electrode 43. A depth of the groove 29 is equal to or greater than 0.1 µm and equal to or less than 1 µm, and may be equal to or less than 0.5 µm. The insulating film 46 having the MIS structure continuously covers the pixel electrodes 41, 42, and 43 and the groove 29. The photoelectric conversion film 50 is provided with a projection 58 located in the groove 29. A part of the projection 58 is located between the pixel electrode 41 and the pixel electrode 42, and a part of another projection 58 is located between the pixel electrode 42 and the pixel electrode 43. With the existence of the projection 58, a projecting portion 59 along the groove 29 is provided on the lower surface 502 of the photoelectric conversion film 50. The recessed portion 55 that satisfies D>T and L>G is provided on the upper surface 501 of the photoelectric conversion film 50 as in the first embodiment. The shape of the recessed portion 55 in the second embodiment reflects the shape of the projecting portion 59.

Figure 6A:
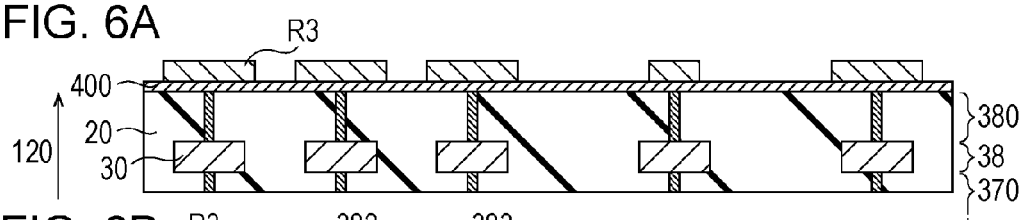
FIGS. 6A to 6F are schematic sectional views illustrating an exemplary method for manufacturing an image pickup apparatus.

A method for manufacturing the image pickup apparatus 1000 illustrated in FIG. 5A is described with reference to FIGS. 6A to 6f. First, in the same manufacturing method as illustrated in FIG. 4A, a multilayer wiring structure 120 provided with the conductive member 30 and the insulating member 20 is formed. Next, as illustrated in FIG. 6A, a conducting film 400 is formed on the multilayer wiring structure 120 to cover the connecting portions 381, 382, and 383. Then, a mask R3 having the shapes of the pixel electrodes 41, 42, and 43, the wiring 44, and the pad 45 is formed on the conducting film 400.

Figure 6B:
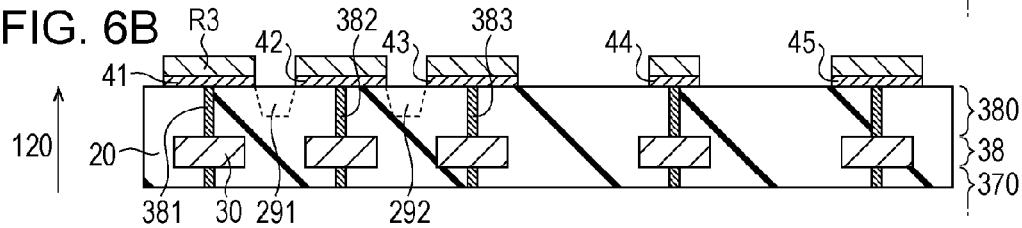

Next, as illustrated in FIG. 6B, the electrode layer 40 provided with the pixel electrodes 41, 42, and 43, the wiring 44, and the pad 45 is formed through patterning by means of etching the conducting film 400 using the mask R3.

Figure 6C:
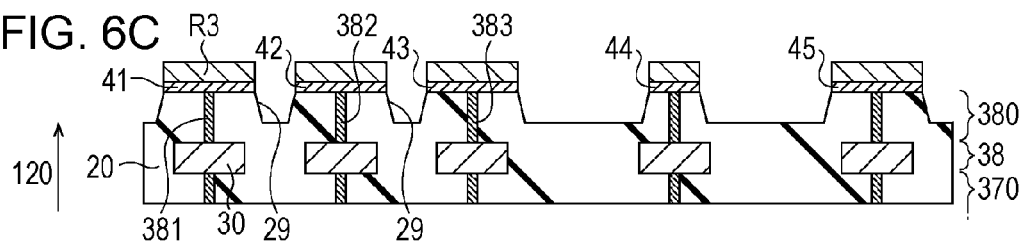

The insulating member 20 is continuously etched using the mask R3. Thus, as illustrated in FIG. 6C, a portion 291 of the insulating member 20 located between the connecting portion 381 and the connecting portion 382 and not overlapping the pixel electrodes 41 and 42 is removed to form the groove 29 on the upper surface of the insulating member 20. Then, a portion 292 of the insulating member 20 located between the connecting portion 382 and the connecting portion 383 and not overlapping the pixel electrode 42 and the 43 is removed to form the groove 29 on the upper surface of the insulating member 20. Although the conducting film 400 and the insulating member 20 may be etched under different etching conditions, the conducting film 400 and the insulating member 20 may be etched successively under the same etching condition. Here, the same mask R3 is used in etching the conducting film 400 and in forming the groove 29. Thus, the mask formation process is simplified and misalignment is reduced, thereby increasing the yield. Note that different masks may be used for the formation of the groove 29 and the etching of the conducting film 400.

Although the mask for the formation of the groove 29 may be a resist mask, a hard mask is desirably used if the mask is used both for the etching of the conducting film 400 and the forming of the groove 29.

Figure 6D:
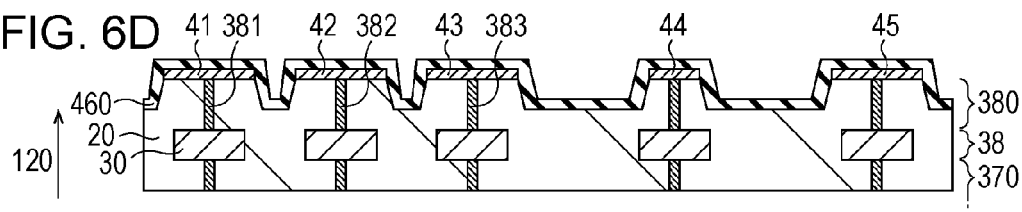

The mask R3 is removed and the insulating film 460 is formed to cover the groove 29 and the pixel electrodes 41, 42, and 43 as illustrated in FIG. 6D.

Figure 6E:
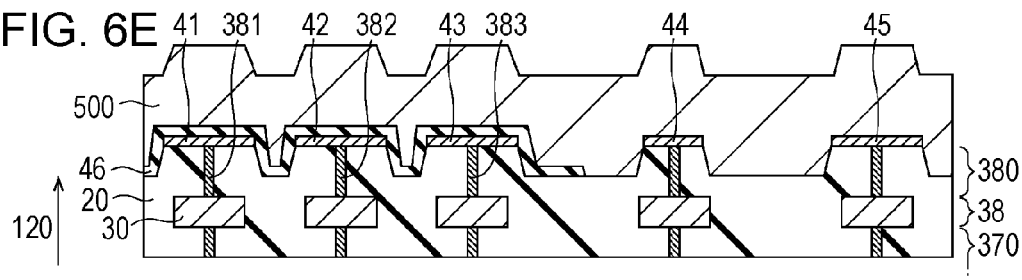

Next, as illustrated in FIG. 6E, the insulating film 460 formed to cover the pixel electrodes 41, 42, and 43, the wiring 44, and the pad 45 is patterned to expose the wiring 44 and the pad 45, whereby the insulating film 46 is formed. In this manner, a component in which the pixel electrodes 41, 42, and 43 are arranged on the wiring structure 120 having the groove 29 is prepared. On this component, the photoelectric conversion film 500 is formed to cover the pixel electrodes 41, 42, and 43, the wiring 44, and the pad 45. At this time, unevenness reflecting the shape of the upper surface of the insulating member 20 having the groove 29 is produced on the upper surface of the photoelectric conversion film 500. In the unevenness produced on the upper surface of the photoelectric conversion film 500, a recessed portion reflecting the groove 29 becomes the recessed portion 55. By forming the groove 29 below the lower surfaces of the pixel electrodes 41, 42, and 43, a step equivalent to the sum of the thickness T of the pixel electrodes 41, 42, and 43 and the depth of the groove 29 is produced below the photoelectric conversion film 500. Since the depth D of the recessed portion 55 is greater than the thickness T by the existence of the groove 29, the recessed portion 55 that satisfies the condition D>T described above is formed. Thus, in the formation of the photoelectric conversion film 500, it is necessary to select the photoelectric conversion film 500 so that the recessed portion 55 having the depth reflecting the existence of the groove 29 is formed. Vapor phase film deposition is advantageous in forming the recessed portion 55 having the depth strongly reflecting the existence of the groove 29 compared with liquid phase film deposition and solid phase film deposition.

Figure 6F:
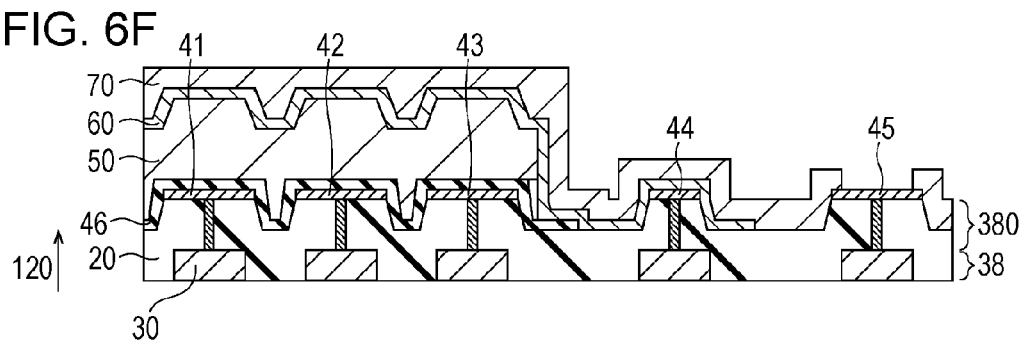

Next, by removing unnecessary portions of the photoelectric conversion film 500 using a suitable mask, the photoelectric conversion film 50 provided with the recessed portion 55 is formed as illustrated in FIG. 6F. The opposite electrode 60 and the dielectric film 70 are formed in the same manner as in the first embodiment.

In the present embodiment, the recessed portion 55 can be formed by formation of the groove 29, without etching the photoelectric conversion film 50. Since damage to the photoelectric conversion film 50 caused by etching can be reduced, noise and malfunction can be reduced. Further, the recessed portion 55 can be formed appropriately even in a case where the photoelectric conversion film 50 is formed by a material that is difficult to process by etching.

Third Embodiment

Next, a method for manufacturing an image pickup apparatus according to a third embodiment is described with reference to FIGS. 7A to 7C. The third embodiment differs from the second embodiment in the method for forming the electrode layer 40 and the insulating film 46. Other configurations are the same as those of the second embodiment, and description thereof is omitted.

Figure 7A:
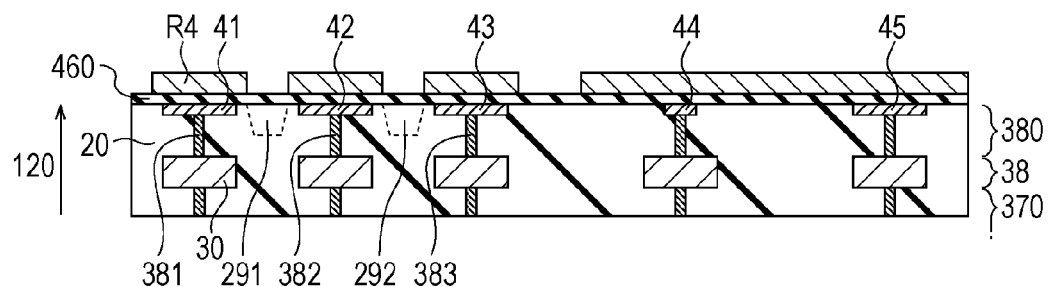
FIGS. 7A to 7C are schematic sectional views illustrating an exemplary method for manufacturing an image pickup apparatus.

As illustrated in FIG. 7A, the pixel electrodes 41, 42, and 43 constituting the electrode layer 40, the wiring 44, and the pad 45 are formed by a damascene process. The damascene process is performed in the following manner. First, a groove is formed on the upper surface of the insulating member 20. Next, a conducting film for the electrode layer 40 is embedded in the groove. The conducting film protruding from the groove is removed by, for example, a CMP method. Thus, a structure in which the upper surface of the electrode layer 40 including the pixel electrodes 41, 42, and 43, the wiring 44, and the pad 45, and the upper surface of the insulating member 20 substantially continue (i.e., a damascene structure) is obtained.

Figure 7B:
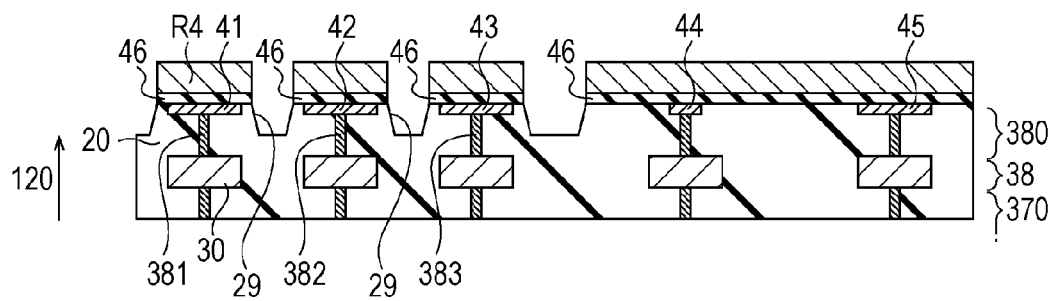

Next, as illustrated in FIG. 7B, the insulating film 460 is formed on the pixel electrodes 41, 42, and 43, the wiring 44, and the pad 45. A mask R4 having openings at at least portions located between the pixel electrodes 41, 42, and 43 is formed on the insulating film 460. By etching the insulating film 460 using the mask R4, a discontinuous insulating film 46 is formed by patterning.

Subsequently, the insulating member 20 is etched using the mask R4. Thus, as illustrated in FIG. 7B, a portion 291 of the insulating member 20 located between the connecting portion 381 and the connecting portion 382 and not overlapping the pixel electrodes 41 and 42 is removed to form the groove 29 on the upper surface of the insulating member 20. Then, a portion 292 of the insulating member 20 located between the connecting portion 382 and the connecting portion 383 and not overlapping the pixel electrode 42 and the 43 is removed to form the groove 29 on the upper surface of the insulating member 20. Although the insulating film 460 and the insulating member 20 may be etched under different etching conditions, the insulating film 460 and the insulating member 20 may be etched successively under the same etching condition. Here, the same mask R4 is used in etching the insulating film 460 and in forming the groove 29. Thus, the mask formation process is simplified and misalignment is reduced, thereby increasing the yield. Note that different masks may be used for the formation of the groove 29 and the etching of the insulating film 460. The mask (i.e., the mask R4) for the formation of the groove 29 may be a resist mask, and may be a hard mask. In this manner, a component in which the pixel electrodes 41, 42, and 43 are arranged on the wiring structure 120 having the groove 29 is prepared.

Figure 7C:
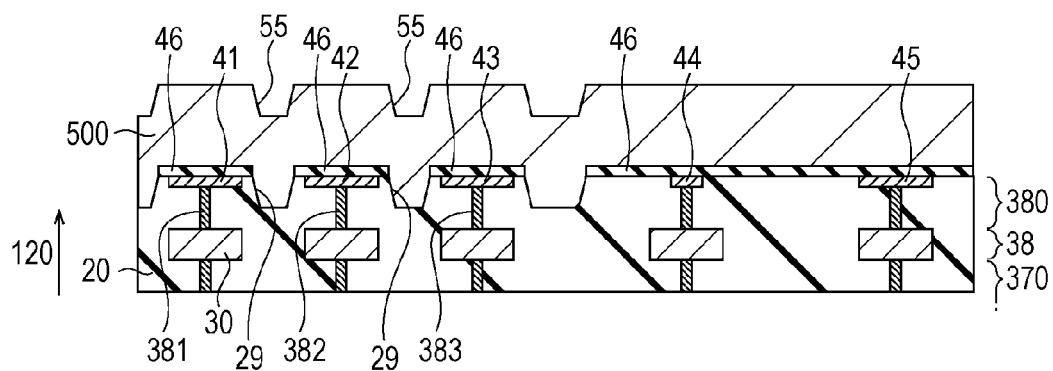

Then, as illustrated in FIG. 7C, the photoelectric conversion film 500 covering the pixel electrodes 41, 42, and 43 and the groove 29 is formed on the upper surface of the pixel electrodes 41, 42, and 43 of the photoelectric conversion film 500 so that the recessed portion 55 corresponding to the groove 29 is formed. Processes thereafter are the same as those of the second embodiment, and description thereof is omitted. It is only necessary to remove a part of the insulating film 460 remaining on the pad 45 at suitable timing, e.g., at the time of patterning the opposite electrode 60 or the dielectric film 70.

Fourth Embodiment

Figure 8A:
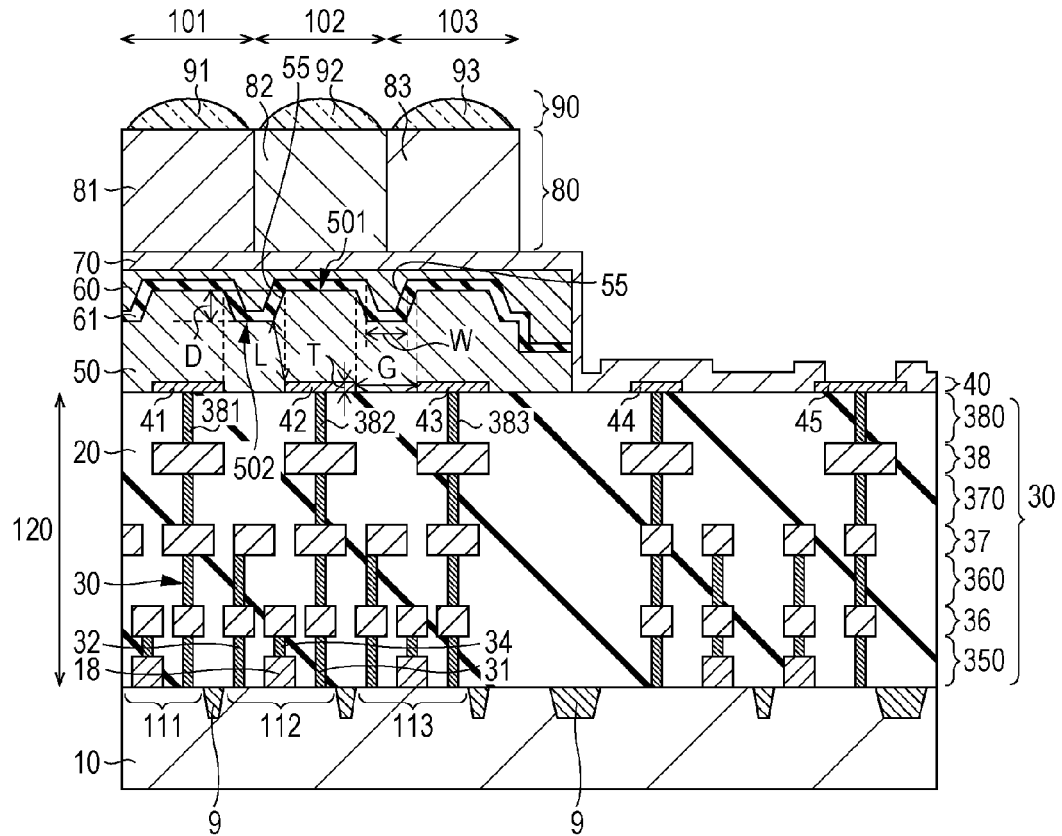
FIGS. 8A and 8B are schematic sectional views illustrating an exemplary image pickup apparatus.
Figure 8B:
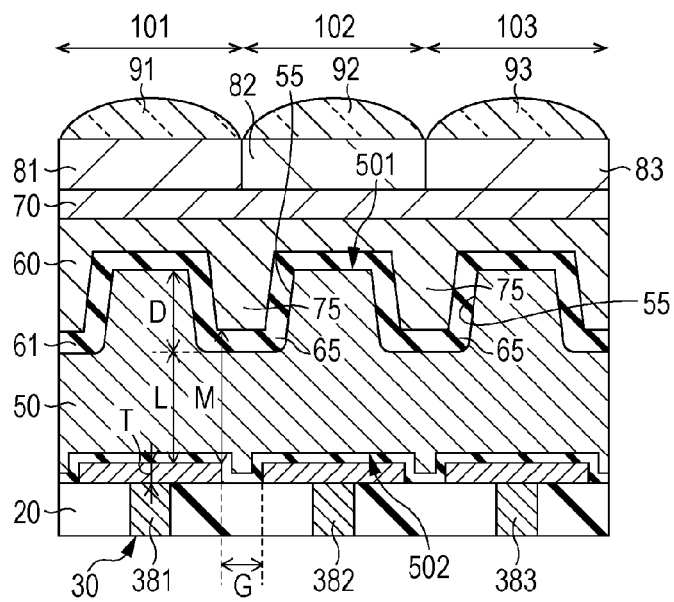

An image pickup apparatus 1000 according to a fourth embodiment is described with reference to FIGS. 8A and 8B. FIG. 8A illustrates a cross section of the pixel region 1 along line IIA-IIA of FIG. 1B, and a cross section of the peripheral region 2. FIG. 8B is an enlarged cross-sectional view of a neighborhood of the photoelectric conversion film 50. The fourth embodiment differs from the first embodiment mainly in the structure of the photoelectric conversion film 50 on the side of the pixel electrodes 41, 42, and 43, and in the structure on the side of the opposite electrode 60. Description is omitted about the same matters as those of the first embodiment.

In the present embodiment, as illustrated in FIG. 8A, no insulating film 46 is provided between the pixel electrodes 41, 42, and 43 and the photoelectric conversion film 50, and the pixel electrodes 41, 42, and 43 are in contact with the photoelectric conversion film 50. Contact between the pixel electrodes 41, 42, and 43 and the photoelectric conversion film 50 is ohmic contact or Schottky contact. An insulating film 61 is provided between the opposite electrode 60 and the photoelectric conversion film 50. The insulating film 61 is in contact with the photoelectric conversion film 50, and the MIS structure is constituted by the opposite electrode 60 (Metal), the insulating film 61 (Insulator), and the photoelectric conversion film 50 (Semiconductor). Note that a configuration in which, instead of providing the insulating film 61, the opposite electrode 60 (Metal) and the photoelectric conversion film 50 (Semiconductor) are in contact with each other, and the photoelectric conversion film 50 and the pixel electrodes 41, 42, and 43 are in contact with each other may also be employed.

The recessed portion 55 satisfies D>T and L>G like the first to the third embodiments described above. Thus, sensitivity can be improved and the image lag can be reduced at a portion distant from the pixel electrodes 41, 42, and 43 by the distance G or longer (which corresponds to the second portion 542 in FIGS. 3A to 3D) in the intermediate portion 54. The opposite electrode 60 projects toward the recessed portion 55, and a part of the projected opposite electrode 60 is surrounded by the recessed portion 55. Thus, field intensity of the intermediate portion 54 can be increased to reduce the image lag. In the present embodiment, the opposite electrode 60 is not in contact with the recessed portion 55 and L>M. In this case, a difference between the distance L and the distance M corresponds to the thickness of the insulating film 61 in the recessed portion 55.

Next, a method for manufacturing an image pickup apparatus according to a fourth embodiment is described with reference to FIGS. 9A to 9D. The manufacturing method of the image pickup apparatus according to the fourth embodiment is substantially the same as that of the image pickup apparatus according to the first embodiment, and only difference is described.

Figure 9A:
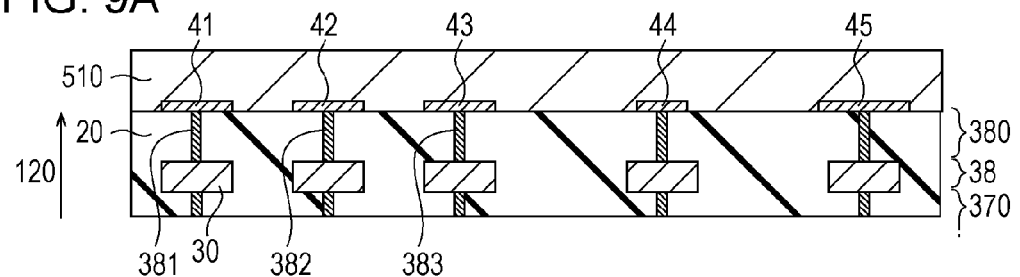
FIGS. 9A to 9D are schematic sectional views illustrating an exemplary method for manufacturing an image pickup apparatus.

As illustrated in FIG. 9A, a first photoelectric conversion layer 510 is formed on the pixel electrodes 41, 42, and 43 formed on the wiring structure 120. The first photoelectric conversion layer 510 is provided with no recessed portion on the upper surface thereof, or provided with a recessed portion having a depth equal to or less than the thickness T of the pixel electrodes 41, 42, and 43. That is, the first photoelectric conversion layer 510 is not provided with a recessed portion having a depth equal to or greater than the thickness T of the pixel electrodes 41, 42, and 43.

Figure 9B:
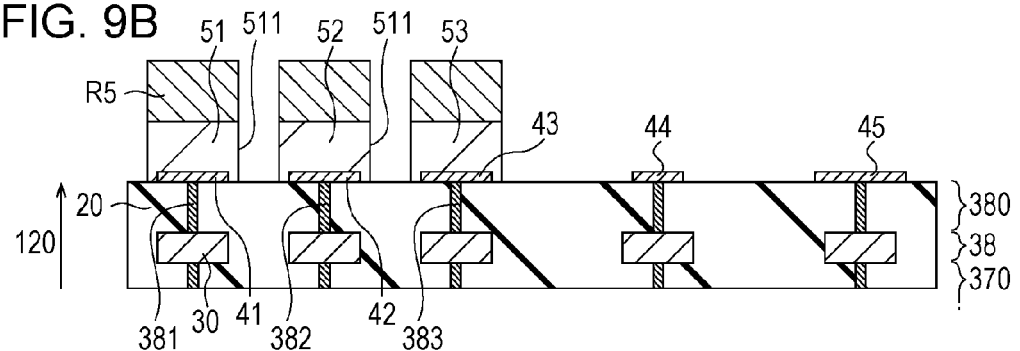
Figure 9C:
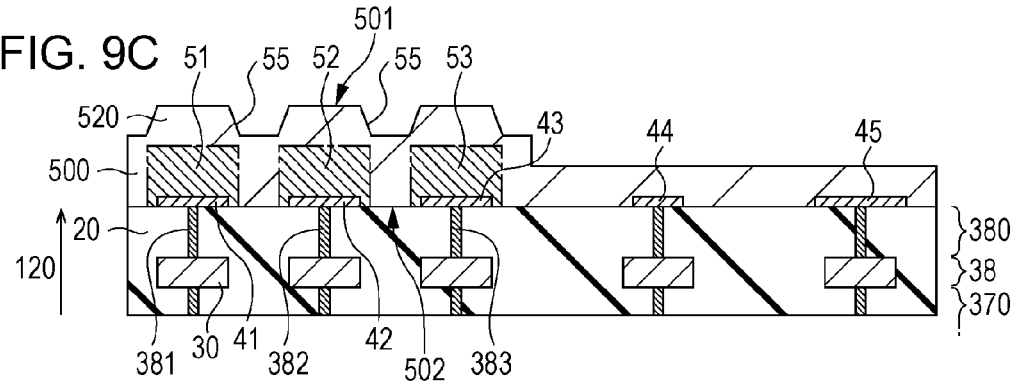

As illustrated in FIG. 9B, a mask R5 is formed at portions of the first photoelectric conversion layer 510 corresponding to the pixel electrodes 41, 42, and 43. The mask R5 has openings corresponding to the portions located between the pixel electrodes 41, 42, and 43. The first photoelectric conversion layer 510 is etched using the mask R5, and a groove 511 is formed in the first photoelectric conversion layer 510. A portion of the first photoelectric conversion layer 510 sandwiched between the grooves 511 at least becomes the photoelectric conversion portion 51, 52, and 53 corresponding to the pixel electrodes 41, 42, and 43. Instead of patterning the pixel electrodes 41, 42, and 43 before forming the first photoelectric conversion layer 510, the first photoelectric conversion layer 510 may be formed on a conducting film that becomes the pixel electrodes 41, 42, and 43. It is also possible to etch the first photoelectric conversion layer 510 and the conducting film using the mask R5 to pattern the photoelectric conversion portion 51, 52, and 53 and the pixel electrodes 41, 42, and 43, respectively.

The depth of the groove 511 is desirably greater than the thickness T of the pixel electrodes 41, 42, and 43. The groove 511 of this example is a penetrating groove reaching the insulating member 20 from the upper surface of the first photoelectric conversion layer 510, of which depth is equal to the depth of the first photoelectric conversion layer 510. Note that the depth of the groove 511 may be smaller than the thickness of the first photoelectric conversion layer 510 so that the bottom of the groove 511 is formed by the first photoelectric conversion layer 510.

The mask R5 is removed and a second photoelectric conversion layer 520 is formed along the groove 511 to cover the photoelectric conversion portion 51, 52, and 53. The photoelectric conversion film 500 is formed by the portion formed from the first photoelectric conversion layer 510 (i.e., the photoelectric conversion portion 51, 52, and 53) and the second photoelectric conversion layer 520. The recessed portion 55 corresponding to the groove 511 is formed on the upper surface 501 of the photoelectric conversion film 500 formed by the second photoelectric conversion layer 520. It is only necessary to select the depth and the width of the groove 511, and the thickness and the film deposition method of the second photoelectric conversion layer 520 so that the depth of the recessed portion 55 satisfies D>T.

Figure 9D:
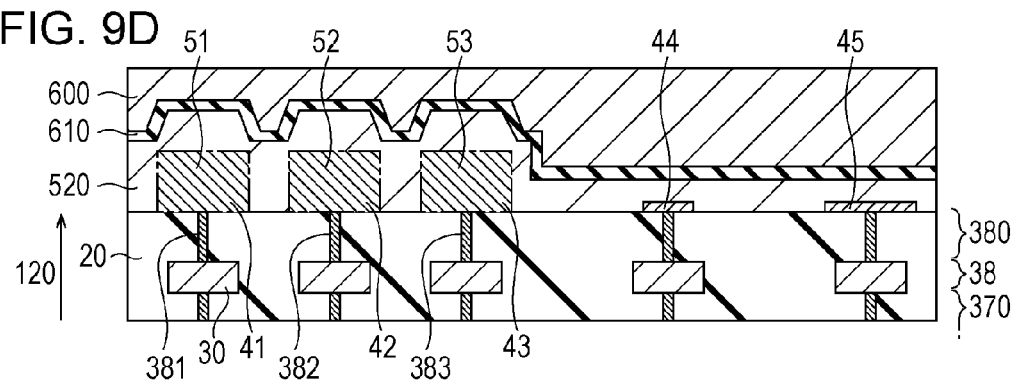

Then, as illustrated in FIG. 9D, an insulating film 610 is formed along the upper surface 501 of the photoelectric conversion film 500 that includes the recessed portion 55. A conducting film 600 is formed on the insulating film 610.

Then the opposite electrode 60 illustrated in FIG. 8A is formed from the conducting film 600 by etching the conducting film 600 using a suitable mask. By etching the insulating film 610, the insulating film 61 illustrated in FIG. 8A is formed from the insulating film 610. By etching the photoelectric conversion film 500 (i.e., the second photoelectric conversion layer 520), the photoelectric conversion film 50 illustrated in FIG. 8A is formed from the photoelectric conversion film 500 (i.e., the second photoelectric conversion layer 520). A single mask may be used for the films to be etched, or different masks may be used for each film to be etched.

The embodiments described above are summarized as follows. The image pickup apparatus 1000 is provided with the pixel electrode 41 and the pixel electrode 42 adjoining to the pixel electrode 41. The image pickup apparatus 1000 is further provided with the photoelectric conversion film 500 that continuously covers the pixel electrode 41 and the pixel electrode 42. The photoelectric conversion film 50 is provided with the recessed portion 55 recessed toward a portion between the pixel electrode 41 and the pixel electrode 42 on the upper surface 501 opposite to the pixel electrode 41 and the pixel electrode 42. The depth D of the recessed portion 55 is greater than the thickness T of the pixel electrode 41. The distance L from the pixel electrode 41 to the recessed portion 55 is greater than the distance G from the pixel electrode 41 to the pixel electrode 42. According to the image pickup apparatus 1000 described above, an image pickup apparatus capable of improving sensitivity and reducing occurrence of an image lag can be provided.

The embodiments described above are not limited to each of the embodiments, but a plurality of embodiments can be combined for implementation. Various changes, such as replacement, deletion, or addition of the components, may be made without departing from the scope of the present disclosure.

According to the technique of the present disclosure, an image pickup apparatus capable of improving sensitivity and reducing occurrence of an image lag can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-156787, filed Jul. 31, 2014 which is hereby incorporated by reference herein in its entirety.

What is claimed is:

1. An image pickup apparatus, comprising:
a first pixel electrode;
a second pixel electrode adjoining to the first pixel electrode; and
a photoelectric conversion film configured to continuously cover the first pixel electrode and the second pixel electrode;
an opposite electrode facing the first pixel electrode and the second pixel electrode via the photoelectric conversion film,
wherein
the photoelectric conversion film includes a recessed portion recessed toward a portion between the first pixel electrode and the second pixel electrode on a surface opposite to the first pixel electrode and the second pixel electrode,
the depth of the recessed portion is greater than a thickness of the first pixel electrode, and the shortest distance from the first pixel electrode to the recessed portion is greater than the shortest distance from the first pixel electrode to the second pixel electrode, and
the opposite electrode is provided continuously along the surface via the photoelectric conversion film, and a part of the opposite electrode is surrounded by the recessed portion.

2. The image pickup apparatus according to claim 1, wherein a width of the recessed portion is greater than the shortest distance from the first pixel electrode to the second pixel electrode.

3. The image pickup apparatus according to claim 1, wherein the opposite electrode is formed by a transparent conductive material.

4. The image pickup apparatus according to claim 1, wherein the opposite electrode are in contact with the recessed portion.

5. The image pickup apparatus according to claim 1, wherein the depth of the recessed portion, the shortest distance from the first pixel electrode to the recessed portion, and the shortest distance from the first pixel electrode to the second pixel electrode are less than 0.5 μm.

6. The image pickup apparatus according to claim 1, wherein a dielectric film having a refractive index lower than that of the photoelectric conversion film are provided continuously along the surface so as to face the first pixel electrode and the second pixel electrode via the photoelectric conversion film, and a part of the dielectric films is surrounded by the recessed portion.

7. The image pickup apparatus according to claim 1, wherein an insulating film is provided between the first pixel electrode and the photoelectric conversion film.

8. The image pickup apparatus according to claim 1, wherein a thickness of the first pixel electrode is smaller than the shortest distance from the first pixel electrode to the second pixel electrode.

9. The image pickup apparatus according to claim 1, wherein the first pixel electrode and the second pixel electrode are disposed on a common insulating member, and a surface of the insulating member on the side of the first pixel electrode and the second pixel electrode includes a groove recessed to separate from a portion between the first pixel electrode and the second pixel electrode.

10. The image pickup apparatus according to claim 1, wherein the photoelectric conversion film is a quantum dot film.

11. An image pickup system, comprising:
the image pickup apparatus; and
a signal processing apparatus configured to process a signal obtained from the image pickup apparatus
wherein the image pickup apparatus, comprising:
a first pixel electrode;
a second pixel electrode adjoining to the first pixel electrode; and
a photoelectric conversion film configured to continuously cover the first pixel electrode and the second pixel electrode;
an opposite electrode facing the first pixel electrode and the second pixel electrode via the photoelectric conversion film,
wherein
the photoelectric conversion film includes a recessed portion recessed toward a portion between the first pixel electrode and the second pixel electrode on a surface opposite to the first pixel electrode and the second pixel electrode,
the depth of the recessed portion is greater than a thickness of the first pixel electrode, and the shortest distance from the first pixel electrode to the recessed portion is greater than the shortest distance from the first pixel electrode to the second pixel electrode, and
the opposite electrode is provided continuously along the surface via the photoelectric conversion film, and a part of the opposite electrode is surrounded by the recessed portion.

* * * * *